United States Patent [19]

Ressmeyer et al.

[11] 4,357,600

[45] Nov. 2, 1982

[54] MULTISLOPE CONVERTER AND CONVERSION TECHNIQUE

[75] Inventors: James Ressmeyer; Joe E. Marriott; Lawrence T. Jones, all of Loveland, Colo.

[73] Assignee: Hewlett-Packard Company, Palo Alto, Calif.

[21] Appl. No.: 205,818

[22] Filed: Nov. 10, 1980

[51] Int. Cl.³ .............................................. H03K 13/20
[52] U.S. Cl. ........................ 340/347 NT; 340/347 AD
[58] Field of Search ..... 340/347 AD, 347 M, 347 NT

[56] References Cited

U.S. PATENT DOCUMENTS

| | | | |
|---|---|---|---|
| 3,480,948 | 11/1969 | Lord | 340/347 AD |
| 3,737,892 | 6/1973 | Dorey | 340/347 NT |
| 4,082,998 | 4/1978 | Marriott | 340/347 NT |

OTHER PUBLICATIONS

Fullagar, "Electronics", Dec. 9, 1976, pp. 81-89.

*Primary Examiner*—Charles D. Miller

*Attorney, Agent, or Firm*—John A. Frazzini

[57] ABSTRACT

A multislope A/D converter is presented which employs a multislope integration technique enabling the use of a single comparator to detect polarity changes in the integrator output voltage. The A/D converter integrates a test signal during a run-up interval and integrates a discharging signal during the run-up interval as well as during a pre-run-down interval and a run-down interval subsequent to the run-up interval. The magnitude and polarity of the discharging signal are regulated in accordance with a switching scheme that converts circuit element mismatch error into offset measurement errors which can be eliminated by subtraction. The discharging current during the pre-run-down interval ensures that the slope of the integrator output voltage at the final polarity change is independent of test signal polarity thereby avoiding a comparator hysteresis error. A decade-run-down technique is employed during the run-down interval enabling the digital conversion to be implemented on a decade counter.

21 Claims, 11 Drawing Figures

| DISCHARGING CURRENT MAGNITUDE | $I_{+0}$ | $I_{+4}$ | $I_{-0}$ | $I_{+4}$ | $I_{+0}$ |
|---|---|---|---|---|---|
| STATE OF SWITCH 322 | − | 0 | 0 | 0 | − |
| STATE OF SWITCH 323 | 0 | 0 | − | 0 | 0 |
| TRANSITION OF SWITCH 322 | | + | 0 | 0 | − |
| TRANSITION OF SWITCH 323 | | 0 | − | + | 0 |
| DISCHARGING CURRENT MAGNITUDE | $I_{+0}$ | $I_{-4}$ | $I_{-0}$ | $I_{-4}$ | $I_{+0}$ |
| STATE OF SWITCH 322 | − | − | 0 | − | − |
| STATE OF SWITCH 323 | 0 | − | − | − | 0 |
| TRANSITION OF SWITCH 322 | | 0 | + | − | 0 |
| TRANSITION OF SWITCH 323 | | − | 0 | 0 | + |

MULTISLOPE CONVERTER AND CONVERSION TECHNIQUE

BACKGROUND OF THE INVENTION

The disclosed invention relates generally to the digital measurement of an unknown input voltage and more particularly to an analog to digital converter employing a modified version of dual slope integration. As illustrated in FIG. 1, in dual slope integration a test voltage $V_t$ is applied to the input of an integrator for a run-up (RU) interval of duration T. A reference discharging voltage $V_d$ is then applied to the integrator input during a run-down (RD) interval ending when the integrator is totally discharged. The duration t of the RD interval is measured and the value of $V_t$ is calculated as $tV_d/T$.

The value of t is typically measured by counting the number of clock pulses contained in the RD interval. For a given clock rate the sensitivity of the A/D converter increases with an increase in t. Therefore, sensitivity can be increased by decreasing $V_d$. However, an instrument user typically needs or wants a short measurement time so that large values of t are impractical. In the prior art method illustrated in FIG. 2 an increase in sensitivity is achieved without requiring a long RD interval by first using a large discharging voltage $V_{d1}$ to discharge the integrator to a preselected level $V_1$ and then using a much smaller discharging voltage $V_{d2}$ to totally discharge the integrator. The time $t_1$ that $V_{d1}$ is applied and the time $t_2$ that $V_{d2}$ is applied are measured for use in calculating $V_t$.

The sensitivity can also be increased by increasing the maximum value $V_m$ of the output voltage. For a fixed duration of the RU interval (typically 1/60 second to discriminate against the 60 Hertz background Interference) this is achieved by reducing the value of the input resistance $R_i$ of the integrator to increase the slope of the integrator output voltage during run-up. However, for an op Amp integrator the integrator output voltage must be less then the op Amp power supplies. As illustrated in FIG. 2, a large slope during the RU interval can be empoyed without exceeding the voltage of the power supplies by utilizing a saw-tooth shaped curve during the RU interval. In this approach whenever the integrator output voltage is detected as exceeding a voltage $V_2$ a discharging voltage $V_{d3}$ is applied along with the test voltage $V_t$ to the integrator input for an interval of duration $t_3$. The integrator output voltage therefore has a slope proportional to $V_t+V_{d3}$ during such intervals. The total time $t_4$ equal to the sum of the intervals of duration $t_3$ during which $V_{d3}$ is applied is measured for use in calculating $V_t$. In the example shown in FIG. 2A the value of $V_t$ is calculated as $(t_1V_{d1}+t_2V_{d2}+t_4V_{d3})/T$.

Unfortunately the implementation of the method illustrated in FIG. 2 requires 4 extra comparators and 4 extra voltage sources to detect crossings by the integrator output voltage of the comparator voltage levels at $V_1$, $-V_1$, $V_2$, and $-V_2$ volts. These additional comparators and voltage sources increase the complexity and expense of such an A/D converter. In addition the saw-tooth method maintains the integrator output voltage near $V_2$ for much of the run-up interval so that dielectric absorption of the integrator capacitor can introduce a significant error. Another source of error is the hysteresis of the comparator used to detect the zero voltage level crossing at the end of the run-down interval. The effect of this hysteresis is that the comparator detects a "zero" crossing at a slightly different voltage for a negative sloping integrator output voltage than for a positive sloping integrator output voltage.

The conversion technique illustrated in FIG. 2A also produces a multiplicative error due to switch time mismatch errors. In FIG. 2B is shown the switching characteristics for a typical switch such as the switch which is used to selectively couple $V_{d3}$ into the circuit. The ideal switching curve for a switch turned on at time $t_1$ and turned off at time $t_2$ is indicated by the dotted curve in FIG. 2B. The solid curve shows the actual switch response. Because the turning-on and turning-off characteristics are typically not symmetric the total ideal charge transfer proportional to $V_{d3}(t_2-t_1)$ will not equal the actual charge transfer. Because of the switching time mismatch the switch is effectively held open for an additional switching mismatch time $\Delta t$ can be positive or negative) thereby transferring a charge proportional to $V_{d3}(t_2-t_1+\Delta t)$. In a switching scheme such as that in the prior art scheme of FIG. 2 in which the number n of switch activations is proportional to the magnitude of the test signal, such mismatch of switching times will produce an error in the A/D conversion proportional to $n\Delta t$. The integer n is an integer valued step function increasing with increase in the magnitude of the test signal and representing a coarse valuation of $V_t$. The switching time mismatch error results in a multiplicative error in this coarse valuation of $V_t$. To correct for this error such an A/D converter requires a scaling factor which adjusts the measured result before output of the digital result. Such adjustment requires the measurement of a known reference voltage to set the scaling factor and then each subsequent measurement requires a multiplication of the coarse valuation by this factor. Since subtractions are more easily and rapidly executed than multiplications it would be advantageous to convert switch time mismatch scaling errors into offset errors which can be eliminated by subtraction.

SUMMARY OF THE INVENTION

In accordance with the illustrated preferred embodiment a multislope A/D converter employing a single comparator is presented and a multislope A/D conversion technique enabling the use of a single comparator is presented. As in dual slope integration a test signal is applied to the input of an integrator to charge the integrator during a run-up interval of duration T and a discharging signal is applied to the integrator input by a discharging signal source to completely discharge the integrator. The integrator produces an integrator output signal which varies linearly with the time integral of the test signal and also varies linearly with the time integral of the discharging signal. The complete discharge of the integrator is signalled by a change in the polarity of the integrator output signal. To increase the sensitivity of detecting a polarity change the integrator output signal is amplified before application to the input of the comparator. The comparator produces a polarity signal which indicates the polarity of the integrator output signal for use in signalling the complete discharge of the integrator. The complete discharge of the integrator defines the end of a run-down interval subsequent to the run-up interval. The amplified integrator output signal is also fed back through a sample and hold circuit to the integrator to adjust the offset voltage of the integrator. A central processing unit (CPU) is coupled to the discharging signal source and is responsive to the polarity signal to regulate the magnitude of the discharging signal and to calculate the digital value for the input test signal.

The polarity signal is periodically tested by the CPU for use in regulating the magnitude and polarity of the discharging signal and to detect the complete discharge of the integrtor. The polarity tests define a set of frames each extending between two successive tests of the polarity signal. In each frame in the run-up interval and in the run-down interval the CPU regulates the discharging signal source to provide a discharging signal of polarity opposite to that detected at the most recent preceding test of the polarity signal. By employing the polarity signal to regulate the discharging signal as well as to indicate the complete discharge of the integrator only a single comparator is required.

The discharging signal source contains a set of switches which are controlled by the CPU to set the polarity and magnitude of the discharging signal to any one of a finite set of choices. In each frame during the run-up interval the discharging signal assumes only two non-zero values of equal magnitude but opposite polarity—the positive polarity value is denoted as $I_{+4}$ and the negative polarity value is denoted as $I_{-4}$. The initiation of the discharging process during the run-up interval reduces the A/D conversion time and enables a coarse evaluation during the run-up interval. During the run-down interval a decade run-down technique is employed which utilizes a set of values of the discharging signal each of which after the first is one-tenth the magnitude of and opposite polarity to the immediately preceding value. Each of these values is employed in successive frames until a change in polarity is detected at which time the discharging signal source is reset to produce the next value in the set. The use of a set of decreasing magnitudes enables both high sensitivity and high speed of A/D conversion to be achieved. By decreasing the magnitude of successive values by a factor of 1/10 the successive values produce successively more accurate digits of A/D conversion.

A pre-run-down interval is included between the run-up and run-down intervals to ensure that the integrator output signal always has positive polarity at the start of the run-down interval. The polarity signal is periodically tested during the pre-run-down interval and a positive discharging signal is applied until a positive polarity is detected at a polarity test. By ensuring that the integrator output signal is positive at the start of the run-down interval irregardless of test signal polarity the final polarity change during the run-down interval will always be in the same direction thereby avoiding measurement error due to comparator hysteresis.

The switches in the discharging signal source are activated in accordance with a switching scheme which converts switching time mismatch errors into a measurement offset error. The discharging signal during the run-up interval is regulated by control of two switches A and B in the discharging signal source. The four possible values producible by the four ways to activate these 2 switches are the two non-zero values $I_{+4}$ and $I_{-4}$ discussed previously and two zero values $I_{+0}$ and $I_{-0}$. During the run-up interval each frame has a switching interval in which the discharging signal is zero. In addition, in successive switching intervals the choice of zero current alternates between $I_{+0}$ and $I_{-0}$. With this switch activation scheme switches A and B are each activated a number of times which is independent of the test signal thereby making this error independent of the test signal. The offset error is measured in a digital auto-zero routine in which the integrator input is coupled to ground to measure a zero input signal. The result of this measurement is the digital auto-zero correction which is subtracted from the result of a measurement of a test signal to eliminate the offset error.

An analog auto-zero cycle is provided to adjust $I_{+0}$ to zero. In this cycle the integrator input is coupled to ground, the discharging signal source is set to produce the positive signal of magnitude $I_{+0}$ and the sample and hold circuit is activated. The net signal into the integrator adjusts the integrator offset voltage toward a steady state value in which $I_{+0}$ is zero. The sample and hold circuit is then deactivated to hold the integrator offset voltage at this adjusted value.

DESCRIPTION OF THE PREFERRED EMBODIMENT

The disclosed invention presents a multislope A/D conversion technique and an A/D converter for implementing the conversion technique.

A/D CONVERTER

Figure 3:
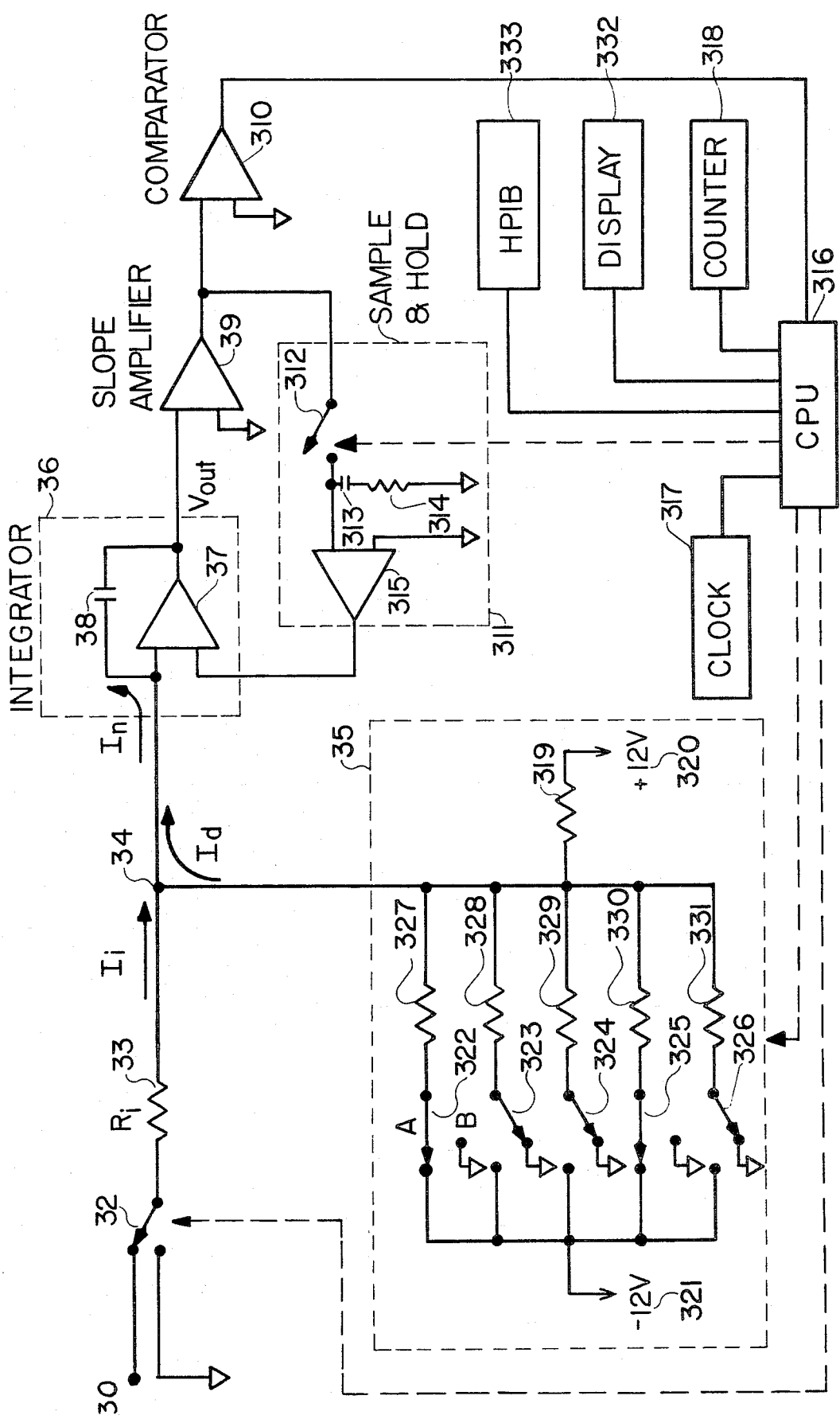
FIG. 3 illustrates the structure of the disclosed A/D converter.

An A/D converter for implementing the technique is shown in FIG. 3. To produce a digital measurement of a test signal of voltage $V_t$, the test signal is applied to an input port 30 of the A/D converter to produce an input test current $I_t$ varying linearly with $V_t$. A grounded input 31 is also provided to enable a zero volt reference to be applied at the A/D converter input to produce a "zero" input current for use in an analog autozero cycle and for use in a digital autozero cycle. Input port 30 and grounded input 31 are selectively coupled by an input switch 32 through an input resistor 33 of resistance $R_i$ to a summing node 34 to provide to the summing node an input current $I_i$ equal to $I_t$ or to the "zero" current. A discharging source 35 is also coupled to summing node 34 to provide a discharging current $I_d$ which adds to the input current to produce a net input current $I_n$.

Summing node 34 is coupled to the input of an integrator 36 to produce an output voltage $V_{out}$ at the output of the integrator varying linearly in time with the time integral of the net input current $I_n$. The output voltage therefore varies linearly in time with the time integral of the input current $I_i$ and also varies linearly in time with the time integral of the discharging current $I_d$. Integrator 36 employs the well known combination of an operational amplifier 37 and a capacitor 38.

The integrator output is coupled through a slope amplifier 39 to the input of a comparator 310. Comparator 310 produces a polarity signal at its output representing the polarity of the integrator output voltage. The comparator signal is high when the integrator output voltage has positive polarity (i.e. positive output voltage) and is low when the integrator output voltage has negative polarity (i.e. negative output voltage). Slope amplifier 39 magnifies the slope of the output signal enabling more sensitive detection of a change in polarity of the output signal.

The output of slope amplifier 39 is coupled to a switch 312 of a sample and hold circuit 311. The sample and hold circuit employs a well known combination of a capacitor 313, a resistor 314 and a buffer amplifier 315. The output of the sample and hold circuit is coupled to the non-inverting input of op Amp 37 and is employed during an analog autozero cycle to adjust the offset voltage of amplifier 37. The autozero cycle will be discussed below when the A/D conversion technique is described.

The output of comparator 310 is coupled to central processing unit (CPU) 316 which controls switch 32, switch 312 and the magnitude of the discharging signal from discharging source 35 in correspondence with the multislope A/D conversion technique. The timing of steps in the multislope A/D conversion technique is regulated in response to a clock signal from a clock 317. CPU 316 also controls a counter 318 for use in calculating the digital value of the voltage $V_t$ of the test signal and a display 332 for output of the digital value.

Discharging source 35 contains a 12 volt positive voltage source 320 which is coupled to summing node 34 through a resistor 319. Source 35 also contains a −12 volt negative voltage source which is selectively coupled by a set of switches 322–326 through a parallel combination of resistors 327–331 to summing node 34. Adequate switching speed can be achieved by use of solid state switches such as switching transistors. Resistors 327 and 328 have equal resistance R, resistor 329 has resistance R/10, resistor 330 has resistance R/100 and resistor 331 has resistance R/1000.

ANALOG AUTOZERO CYCLE

The analog autozero cycle is automatically implemented after every measurement to adjust the offset voltage of integrator 37 to produce zero discharging current for a preselected status of switches 322–326. In this cycle switch 32 couples summing node 34 to grounded input 31 to input a zero reference voltage, switch 312 is turned on to activate sample and hold circuit 311, switches 322 and 325 are switched to negative voltage source 321, and switches 323, 324 and 326 are switched to ground. The resistance of resistor 319 is selected to produce zero discharging current for this switch status. Any non-zero discharging current due to deviations of circuit elements from ideal values is integrated by integrator 38 thereby varying the output voltage. The change in output voltage is amplified by slope amplifier 39 and is fed back through sample and hold circuit 311 to adjust the offset voltage of the non-inverting input of amplifier 37. The change in offset voltage produces an equal change in the voltage of node 34. The system approaches a steady state condition in which the discharging current into integrator 36 has been adjusted to zero. The change in offset voltage is stored as a change in the voltage drop across capacitor 313 so that when switch 312 is turned off at the end of the analog autozero cycle the net input current remains zero.

Because resistors 327 and 328 have equal resistance the discharging current is also zero if switch 322 is switched to ground and switch 323 is switched to negative voltage source 321. The zero current with switch 323 switched to ground is denoted as $I_{+0}$ and the zero current with switch 322 switched to ground is denoted as $I_{-0}$. With the status of switches 32 and 324–326 unchanged, a positive discharging current of magnitude $I_{+4}$ is generated by switching both switch 322 and 323 to ground and a negative discharging current of magnitude $I_{-4}$ is generated by switching both swith 322 and 323 to negative voltage source 321. Because resistors 327 and 328 have equal resistance, $I_{+4}$ equals $-I_{-4}$.

Discharging source 35 can also provide a discharging current of magnitudes $I_{-3}$, $I_{+2}$ and $I_{-1}$ related to $I_{+4}$ by the relations $I_{-3} = -10^{-1}I_{+4}$, $I_{+2} = 10^{-2}I_{+4}$ and $I_{-1} = -10^{-3}I_{+4}$. These magnitudes are produced by changing the status of only one of switches 324–326 from the switch status that produces $I_{+0}$. The discharging current of magnitude $I_{-3}$, $I_{+2}$ or $I_{-1}$ is respectively produced by switching switch 324 to the negative voltage source 321, switch 325 to ground or switch 326 to the negative voltage source 321. Switches 322–326 couple to ground when they don't couple to negative reference source 321 so that the input impedance to integrator 36 is unaffected by the status of the switches 322–326. This insures that leakage currents will be unaffected by the status of these switches.

MULTISLOPE A/D CONVERSION TECHNIQUE

In order to implement a multislope A/D conversion technique on an A/D converter having a single comparator as in FIG. 3, a conversion technique is required which is responsive to only a single comparator output signal. Because the comparator in FIG. 3 detects polarity changes in $V_{out}$, the comparator output signal is just a polarity signal.

Figure 4:
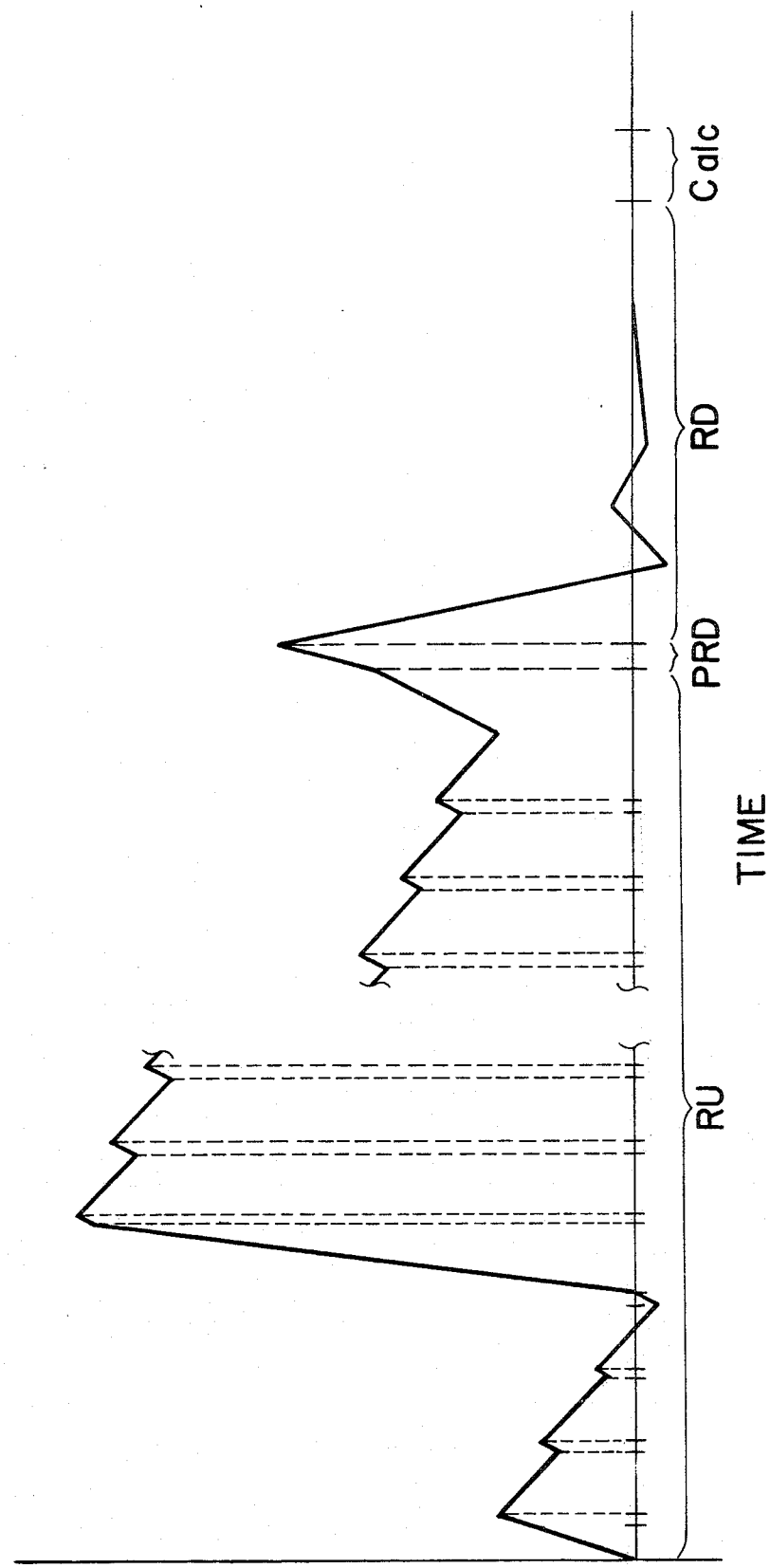
FIG. 4 is a plot of integrator output voltage as a function of time illustrating the multislope A/D conversion technique employed by the A/D converter of FIG. 3.

The execution of the conversion technique is performed in response to a timing signal from clock 317. The polarity signal of comparator 310 is periodically tested by CPU 316 at intervals equal to a fixed number of clock periods to make decisions regarding the magnitude of the discharging signal. As illustrated in FIG. 4, the measurement interval is divided into 4 intervals: (1) a run-up (RU) interval in which a multistep run-up technique is employed to charge an integrator; (2) a run-down (RD) interval, subsequent to the RU interval, in which a decade run-down technique is employed to totally discharge the integrator; (3) a pre-run-down (PRD) interval between the RU and RD intervals to avoid introduction of a comparator hysteresis error; and (4) a calculation (Calc) interval in which the A/D conversion is completed by the CPU. Switch 32 couples to port 30 during the RU interval and couples to grounded input 31 during the other intervals.

MULTISTEP RUN-UP

During the RU interval a test signal of voltage $V_t$ is applied to input port 30 to produce an integrator output voltage $V_{out}$ varying linearly in time with the time integral of the test signal. In order to improve sensitivity and speed the process of discharging the integrator is initiated during the RU interval. The applied test signal produces an input test current $I_t$ which charges the integrator during the entire RU interval of fixed duration T. The integrator is discharged by supplying the discharging current $I_d$ to summing node 34.

Figures 5A, 5B:
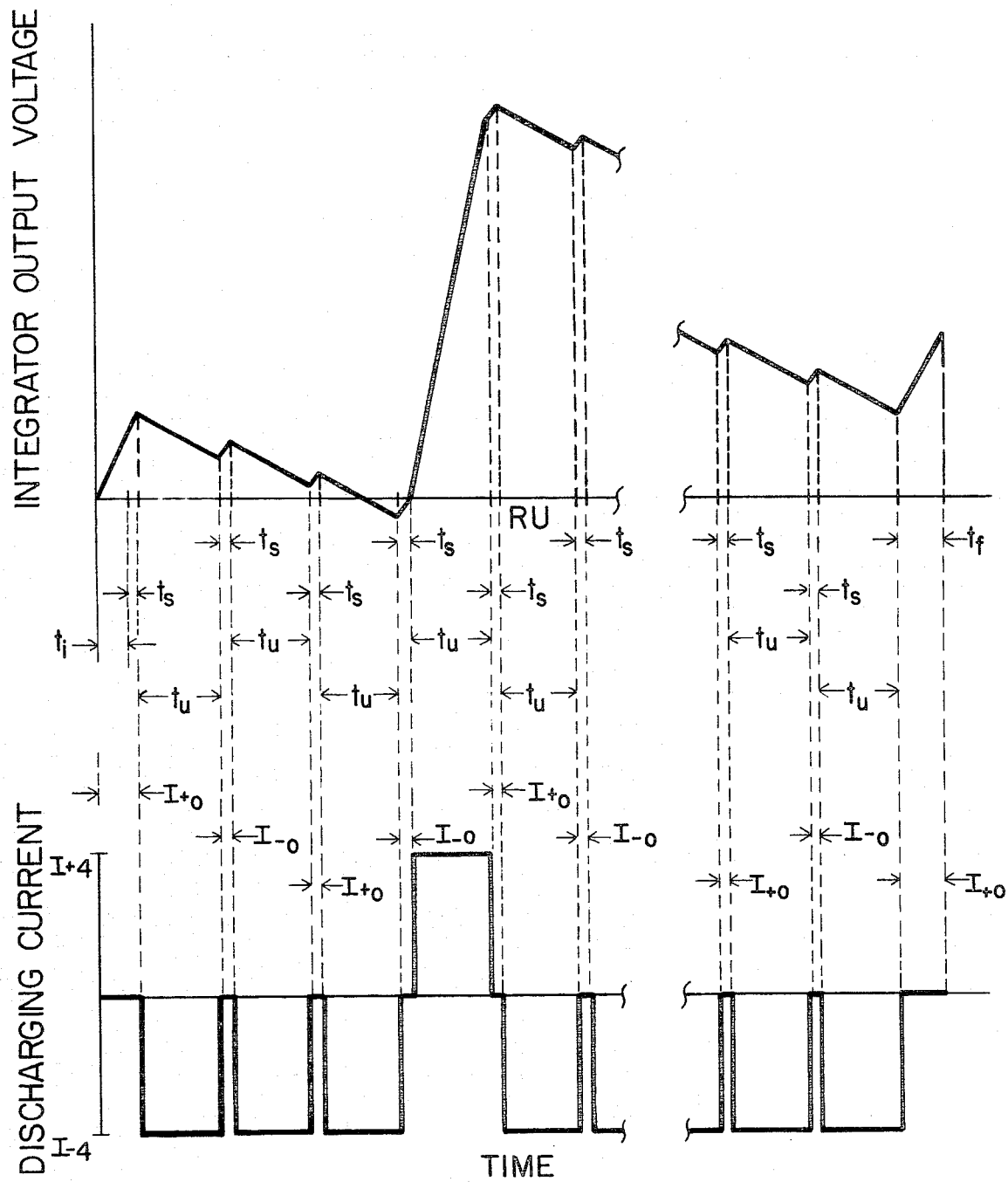
FIG. 5A is an expanded plot of integrator output voltage as a function of time illustrating the portion of the A/D conversion technique occuring during the run-up interval.
FIG. 5B is a plot of discharging current as a function of time associated with the curve in FIG. 5A.

A plot of the output voltage during the RU interval for a typical test signal is shown in FIG. 5A and a plot of the corresponding discharging current is shown in FIG. 5B. The RU interval is divided into an initial interval of duration $t_i$, a sequence of N frames each of duration $t_s + t_u$ and a final interval of duration $t_f$. Each frame is divided into a switching interval of duration $t_s$ and a discharging interval of duration $t_u$.

During the initial interval, the final interval and each of the switching intervals the discharging current is zero so that the slope of the output voltage plot during these intervals is proportional to $I_t$. In each switching interval the polarity of the output voltage is tested and in each of the discharging intervals the discharging current has the negative magnitude $I_{-4}$ if the most recent preceding polarity test was positive and has the positive magnitude $I_{+4}$ if the most recent preceding polarity test was negative.

For a preselected range of applied test voltages the values of $I_{+4}$ and $I_{-4}$ are selected so that $I_t$ is in the range $-t_u I_{-4} > (t_u + t_s)I_t > -t_u I_{+4}$. With this choice of discharging current magnitudes the discharging current is sufficient to keep the output voltage within a finite range. For this choice of parameters the range is $-2CI_{-4}t_u > V_{out} > -2CI_{+4}t_u$ where C is the capacitance of capacitor 38. The maximum value of $V_{out}$ is therefore limited irregardless of the duration T of the RU interval. The sensitivity of the A/D converter can thus be varied by varying the value of T.

The measurement error due to dielectric absorption of integrator capacitor 38 can be reduced by reducing the average magnitude of $V_{out}$. Because $t_u$ can be much smaller than the typical value of T (i.e. 1/60 second), for comparable values of C and discharging current magnitude the dielectric absorption in the multislope A/D conversion technique will be much smaller than in dual slope integration. There is a comparable reduction compared to the prior art multislope technique shown in FIG. 2 because the voltage $V_2$ in that figure is typically comparable to the voltage of the integrator power supplies.

Small values of $t_u$ are advantageous not only to reduce dielectric absorption but also to shorten the duration of the RD interval—for given values of discharging current during the RD interval, the duration of the RD interval is reduced by reduction of the maximum value of $V_{out}$. To keep the value of $I_{+4}$ down it is desirable to supply non-zero discharging current for a major fraction of the RU interval so that $t_u$ should be much larger than $t_s$. Therefore the lower limit for $t_u$ is determined by the lower limit for $t_s$ which in turn is determined by the clock rate and the number of operations which must be performed during each switching interval.

SWITCHING TIME INDEPENDENT SWITCHING SCHEME

Figures 6, 7:
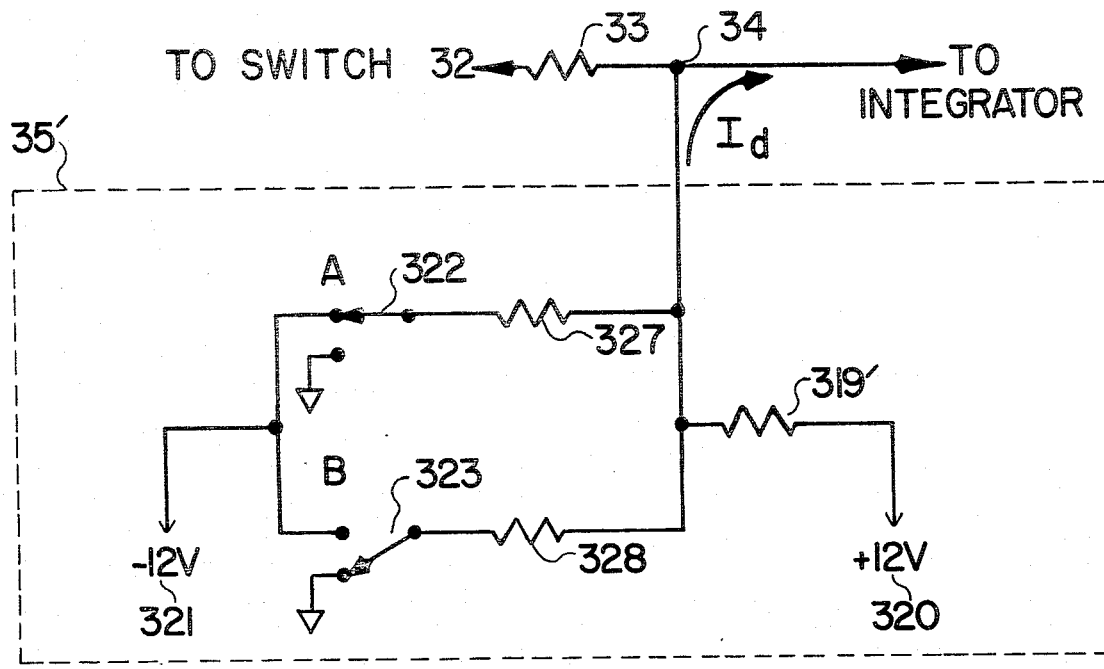
FIG. 6 presents a circuit equivalent to the discharging current source of FIG. 3 during the run-up interval to stress the 2 switch nature of the source during the run-up interval.
FIG. 7 is a table illustrating the switch states and switch transitions that occur during the run-up interval.

During the RU interval the status of switches 324–326 is constant so that during the RU interval discharging source 35 is equivalent to the two switch source 35' shown in FIG. 6. Resistor 319' in source 35' is equivalent during the RU interval to the combination of resistors 329, 330, 331 and 319 of FIG. 3. This simplified equivalent circuit will be used to illustrate the switching scheme utilized in the RU interval.

Figure 1:
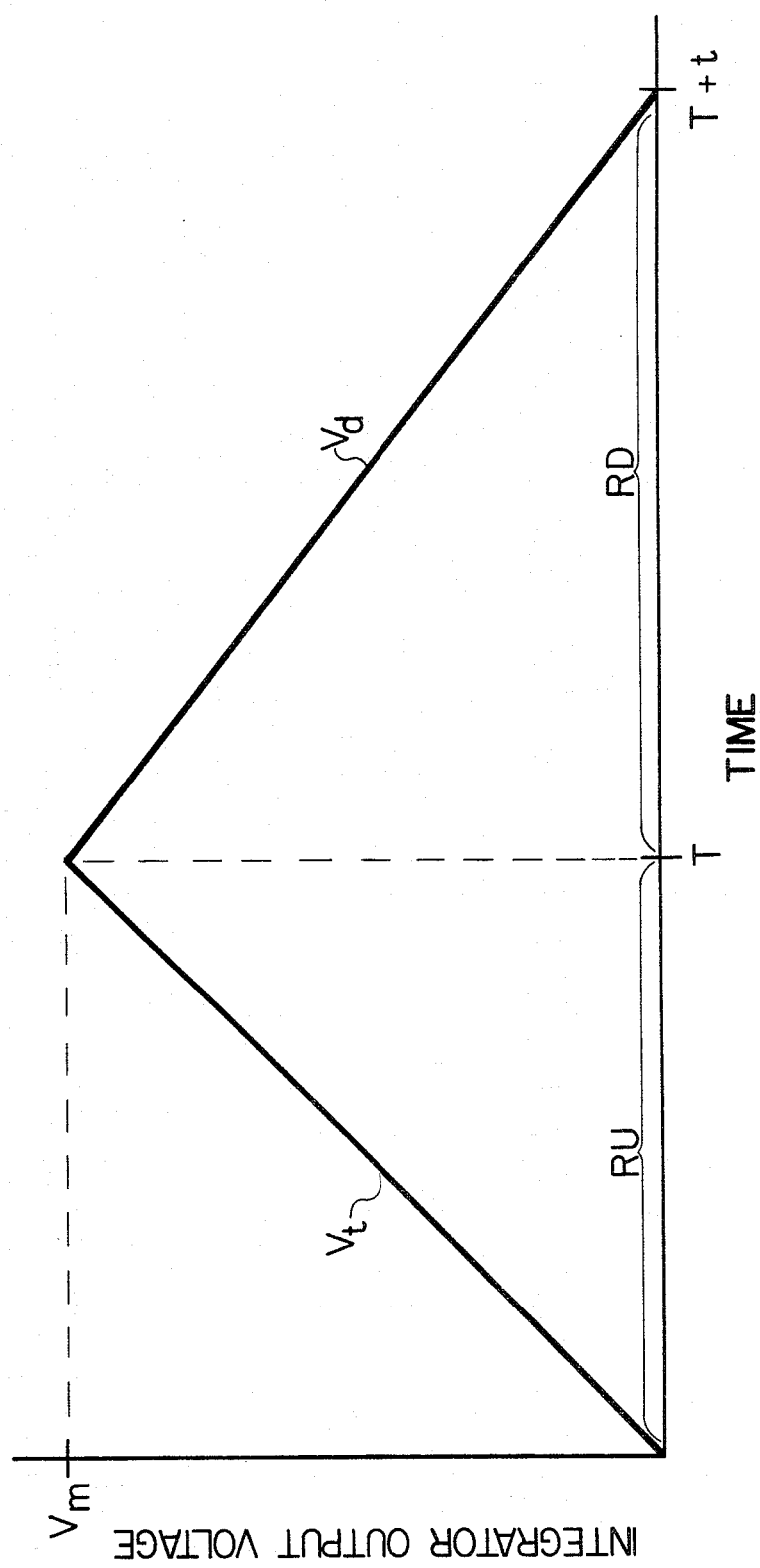
FIG. 1 is a plot of integrator output voltage as a function of time illustrating the prior art technique of dual slope integration.
Figure 2A:
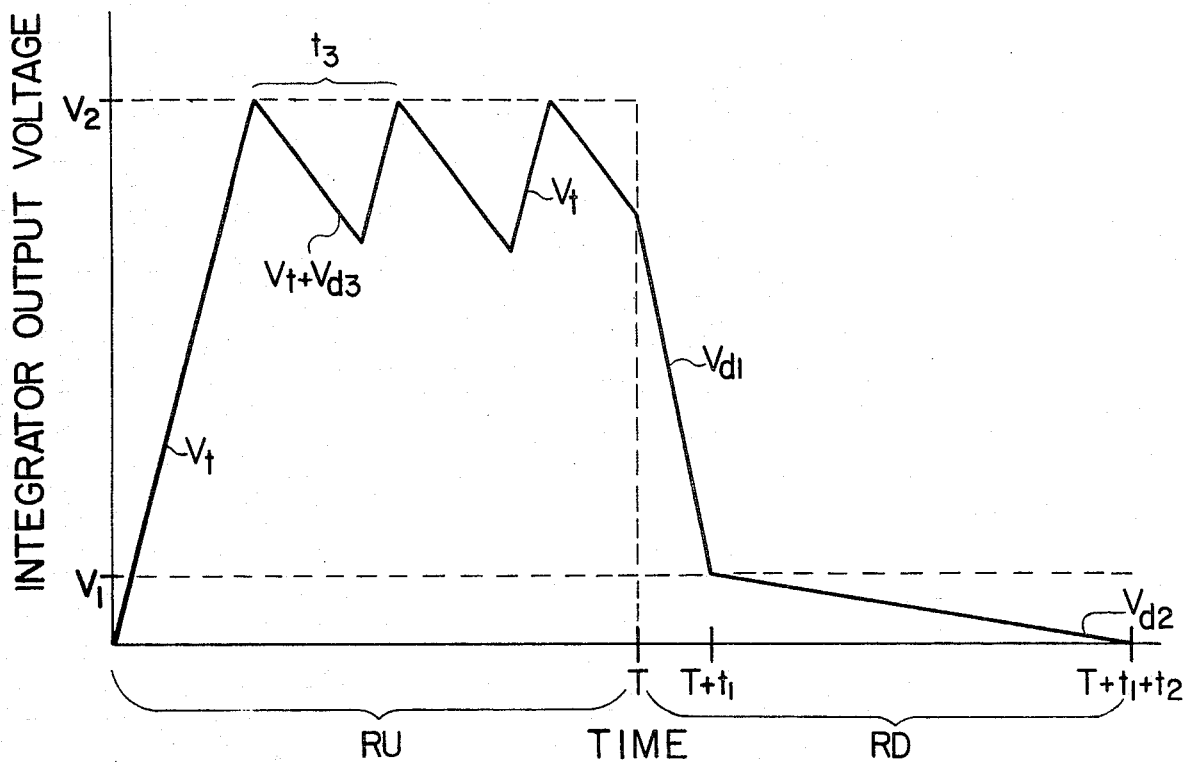
FIG. 2A is a plot of integrator output voltage as a function of time illustrating prior art modifications of the dual slope technique.
Figure 2B:
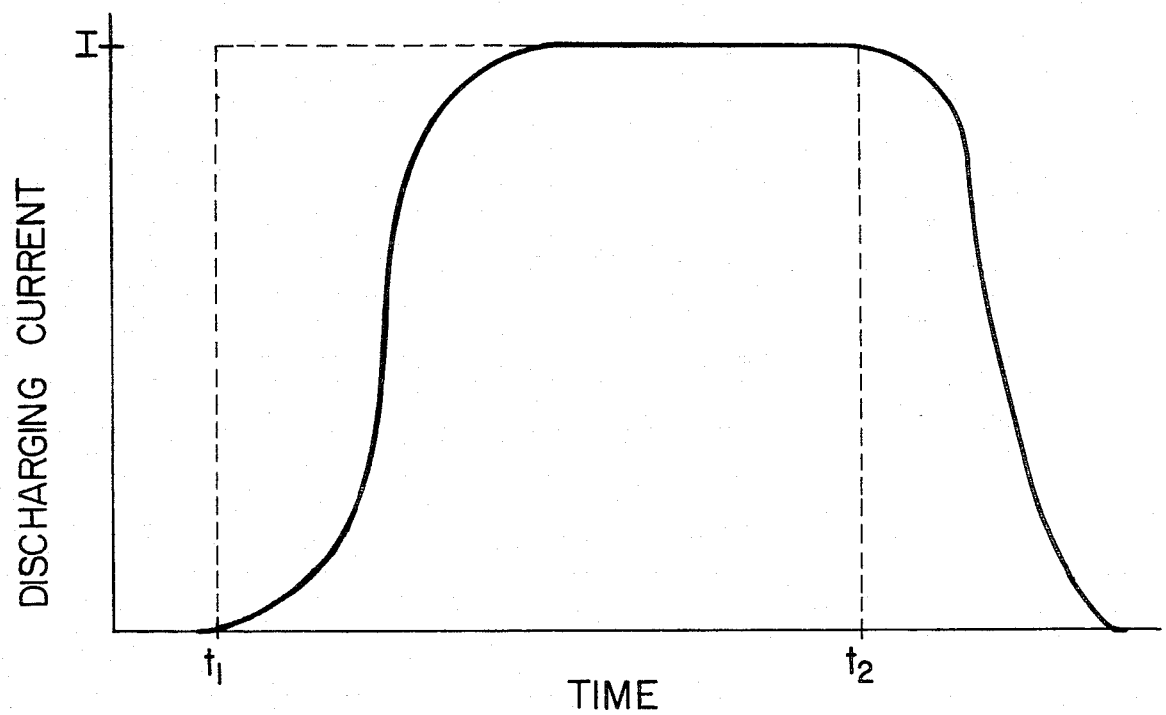
FIG. 2B is a plot of current versus time illustrating the response characteristics of a typical switch.

A switching time independent switching scheme is needed because the numbers of frames in which $I_{+4}$ and $I_{-4}$ are supplied vary linearly with the magnitude of the test signal—as discussed in the background in regard to the method illustrated in FIG. 2A, this can produce a multiplicative scaling error in the measurement. To convert the switching time mismatch into an offset error the RU technique illustrated in FIGS. 5A and 5B utilizes a switching scheme in which switches 327 and 328 are each activated a number of times which is independent of the test signal magnitude. This converts the switching time mismatch into an offset error which can be eliminated by subtraction.

FIGS. 5A and 5B are plots of the integrator output voltage and the discharging current as a function of time during the first few frames of the RU interval. In the switching scheme illustrated in these figures, each discharging interval is sandwiched between a switching interval in which the discharging current has magnitude $I_{+0}$ and a switching interval in which the discharging current has magnitude $I_{-0}$. To see that this scheme results in a constant number of activations of switches 322 and 323, refer to the table in FIG. 7 which shows the switch states for all possible transitions between successive states during the RU interval.

In FIG. 7 the switch state in which the switch couples to ground is denoted by a zero, the switch state in which the switch couples to negative voltage source 321 is denoted by a minus sign, a transition from state 0 to state − is denoted by a minus sign, a transition from state − to state 0 is denoted by a plus sign, and no transition is denoted by a zero. This figure shows that in a transition from $I_{+0}$ to $I_{-0}$ switch 322 makes one + transition and switch 323 makes one − transition regardless of whether the current during the discharging interval in between has magnitude $I_{+4}$ or $I_{-4}$. Similarly in a transition from $I_{-0}$ to $I_{+0}$ switch 322 makes one − transition and switch 323 makes one + transition regardless of the magnitude of the discharging current in the intervening discharging interval. Therefore, in 2 consecutive frames switches 322 and 323 each make one + transition and one − transition regardless of the test signal magnitude or polarity. Therefore the number of frames in the RU interval is selected to be an even number 2N and the magnitude of the discharging current in successive switching intervals is alternated between the magnitudes $I_{+0}$ and $I_{-0}$. The effect of switching time mismatch during the RU interval is to produce a constant offset error $N(I_{+4}\Delta t_1 - I_{-4}\Delta t_2)/C$ where C is the capacitance of integrator capacitor 38, $\Delta t_1$ is the additional time switch 322 couples summing node 34 to ground due to switching time mismatch, and $\Delta t_2$ is the additional time switch 323 couples node 34 to ground due to switching time mismatch.

PRE-RUN-DOWN

Because of the hysteresis of comparator 310 a step change in the polarity signal produced at the output of the comparator occurs at a different integrator output voltage for an increasing integrator output voltage than for a decreasing integrator output voltage. To eliminate this hysteresis effect a pre-run-down (PRD) interval is inserted between the RU interval and the RD interval to ensure that the polarity of the integrator output voltage is always positive at the start of the RD interval irrespective of the test signal polarity.

Figure 8:
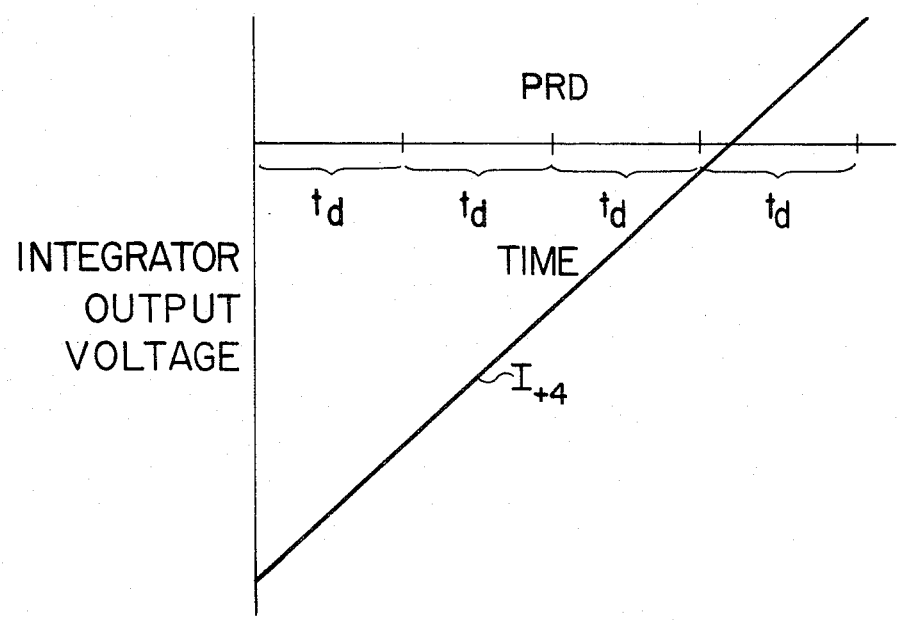
FIG. 8 is an expanded plot of integrator output voltage as a function of time during the pre-run-down interval.

As shown in FIG. 8 the magnitude of the discharging current is set to $I_{+4}$ during the entire PRD interval regardless of the polarity of the integrator output voltage at the start of the PRD interval. The PRD interval is divided into an integral number of frames of duration $t_d$ in each of which the polarity of the integrator output voltage is tested. The PRD interval ends at the completion of the first frame in which a positive polarity is detected. Thus, the PRD interval is an integral multiple of the frame duration $t_d$. The magnitude is set to $I_{+4}$ at the start of the PRD interval even if the polarity of the integrator output signal is already positive so that every measurement will have switch 322 activated to couple summing node 34 to ground during the PRD interval. This ensures that the number of activations of switch 322 is independent of the polarity of the integrator output voltage at the end of the RU interval.

DECADE RUN-DOWN

Figure 9:
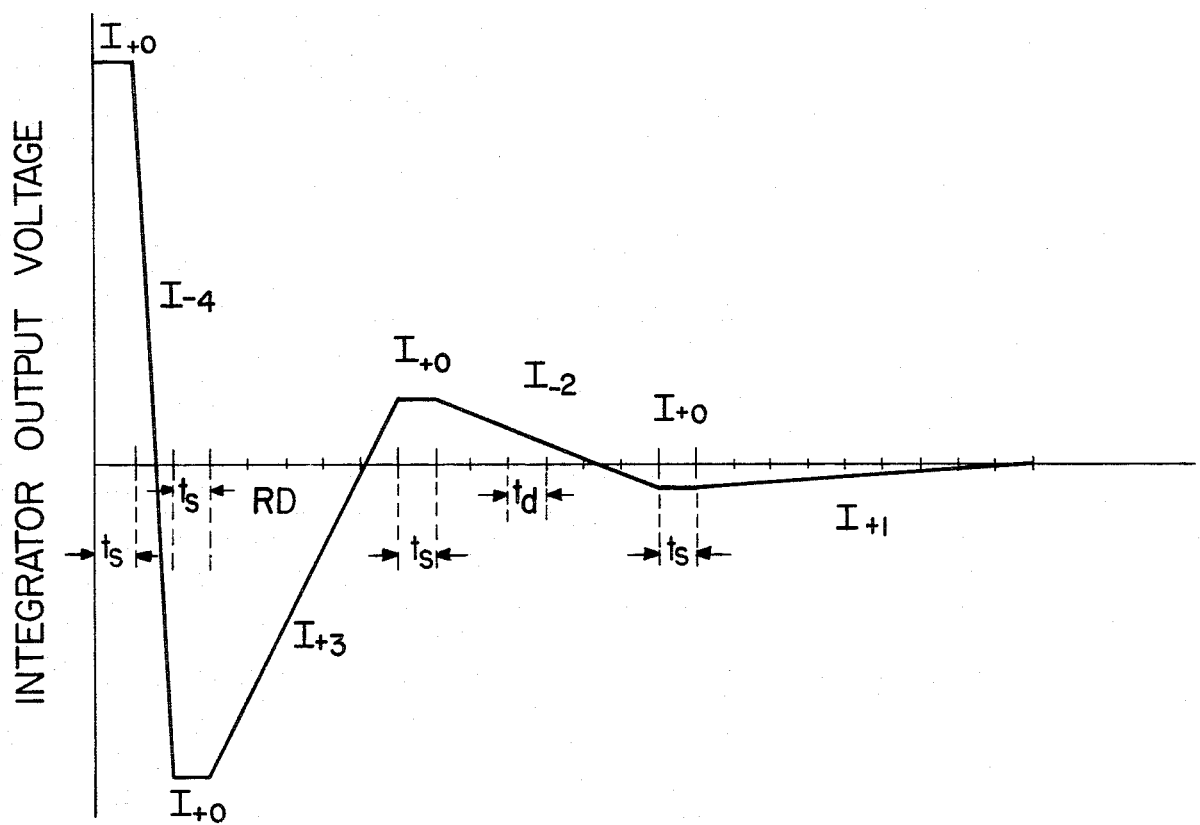
FIG. 9 is an expanded plot of integrator output voltage as a function of time during the run-down interval.

FIG. 9 is a plot of the integrator output voltage during the run-down (RD) interval illustrating the decade run-down technique. The RD interval is divided into an alternating sequence of switching intervals and discharging intervals. Each switching interval has duration $t_s$ and each discharging interval is divided into an integral number of frames of duration $t_d$. In each switching interval the magnitude of the discharging current is successively set to the values $I_{-4}$, $I_{+3}$, $I_{-2}$ and $I_{+1}$. In each frame during a discharging interval the polarity of the integrator output voltage is tested and the discharging interval ends at the completion of the first frame during that discharging interval in which a change in the polarity of the integrator output signal is detected.

The decrease in absolute magnitude of successive values of the discharging current magnitude enables the RD interval to be shortened without loss of sensitivity. The absolute value of the ratio between successive magnitudes is 1/10 so that successive values produce successive digits of sensitivity in the A/D conversion. The frame duration $t_d$ during the RD interval is selected to equal $t_u/10$ so that the magnitude of the discharging current in the first discharging interval during the RD interval can be $I_{-4}$ and still produce a digit more sensitivity than that achieved during the RU interval. Sensitivity is limited by the sensitivity of the comparator in detecting polarity changes in the integrator output voltage thereby placing a lower useful limit on the value of $I_{+1}$. The magnitude $I_{+1}$ is selected so that the change in the amplified integrator output voltage (i.e. the input voltage to comparator 310) in a frame duration $t_d$ is on the order of the sensitivity of the comparator.

CALCULATION AND DIGITAL AUTOZERO

In the calculation (Calc) interval following the RD interval the A/D conversion is completed. The duration of the calculation interval is reduced by performing part of the calculation during the RU, PRD and RD intervals.

The production of a digital value representing the magnitude of the test signal is accomplished by use of a 7 place decade counter 318 which is coupled to CPU 316. In each frame during the RU interval the counter is incremented by 10,000 if the magnitude of the discharging current is $I_{-4}$ in that frame and is decremented by 10,000 if the magnitude of the discharging current is $I_{+4}$ in that frame. The number 2N of frames during the RU interval is selected to be 120 so that the RU interval produces 2 digits of sensitivity plus a 20% overrange protection. The overrange protection ensures that the integrator will not saturate even for signals of absolute magnitude up to 20% above the maximum rating of the A/D converter.

In each frame during the PRD interval the counter is decremented by 1,000. During the RD interval the counter is incremented by 1,000 in each frame in which the magnitude of the discharging current is $I_{-4}$, is decremented by 100 in each frame in which the magnitude is $I_{30\ 3}$, is incremented by 10 in each frame in which the magnitude is $I_{-2}$ and is decremented by 1 in each frame in which the magnitude is $I_{+1}$. Counter 318 provides a direct digital output of $V_t$ by selecting the RU interval duration T, the input resistance $R_i$ of resistor 33, the voltage $V_-$ of voltage source 321, the resistance R of resistors 327 and 328 and the duration $t_d$ of each frame during the PRD and RD intervals to make the ratio $V_-t_dR_i/TR$ be $10^p$ volts for some integer p. With this choice of parameters the number in counter 318 represents the voltage of the test signal in units of $10^p$ millivolts.

The digital autozero cycle is employed to correct the digital value in counter 318 for the offset errors arising in part from the switching time mismatch of switches 322-326. The digital autozero cycle is just a measurement in which summing node 34 is coupled to grounded input 31 by switch 32 instead of to input port 30 as occurs in the measurement of a test signal. The resulting digital value represents the digital autozero correction which is generated in a CPU internal counter and the CPU subtracts the digital autozero correction from the number in counter 318 to produce an offset corrected digital value. The CPU is coupled to an A/D converter output display 332 in which the corrected digital value is displayed. An HPIB interface bus 333 is also included to enable I/O access to various other devices.

The digital autozero cycle is automatically executed at instrument turn-on after completion of the first analog autozero cycle initiated at turn-on. Because the digital autozero cycle is a complete measurement, instrument speed is nearly cut in half by use of this cycle. Therefore the A/D converter has two selectable states—in the first state the digital autozero cycle is executed only at instrument turn-on or upon an express user command and in the second it is executed after each measurement of a test voltage to update the offset correction. These 2 states provide a choice in the trade-off between an increase in accuracy through use of an updated offset correction and an increase in measurement speed by omission of the digital autozero cycle in each measurement.

It is not essential to this multislope integration technique that $I_{+4}$ equal $I_{-4}$ so that the resistances of resistors 327 and 328 need not be equal. However, by making them equal in each frame during the RU interval the counter can be updated by adding or subtracting 1 from the fifth least significant digit. If these resistances were unequal the counter updates would require a more complicated update procedure involving more than one digit of counter 318 in each frame. Also, if resistors 327 and 328 did not have equal resistance, $I_{-0}$ would no longer be zero. However, because the total duration of the intervals in which the discharging current has magnitude $I_{-0}$ is constant, this would result only in an offset error which is eliminated by the digital autozero correction. Similarly the resistances of resistors 329–331 need not be integral powers of 10 smaller than the resistance R of resistor 327 but this choice enables the counter to be updated in each frame during the PRD and RD intervals by the addition or subtraction of 1 from a single digit of the counter.

It is not essential that $I_{+0}$ be zero because a non-zero value would be corrected for by subtraction of the digital autozero correction. The main purpose of the analog autozero cycle is to ensure that $I_{+1}$ and $I_{-2}$ have opposite polarity to ensure that the polarity of the discharging current is correct in each discharging interval. For example if $I_{+1}$ and $I_{-2}$ were both positive then $I_{-2}$ would function to charge the integrator and there would be no subsequent change in polarity of the integrator output voltage—this would prevent completion of the A/D conversion. The analog auto-zero cycle also ensures that $I_{+1}$ is essentially one tenth of $-I_{-2}$ so that the discharging current of magnitude $I_{30\ 1}$ produces an extra digit of sensitivity beyond that produced by the discharging current of magnitude $I_{-2}$. Also, with $I_{+0}$ set to zero a variable length interval in which the discharging current has magnitude $I_{+0}$ can be included at the end (or anywhere else) of the RD interval to keep the total measurement duration constant. By keeping the total duration constant the digital autozero correction will also correct for leakage current errors as well as switching time mismatch errors. If $I_{+0}$ were nonzero such a variable length interval could not be added without affecting the measurement result.

The multistep integration technique can also be modified to accommodate number representations in bases other than base 10. In such a modification decade counter 318 is replaced by one adapted to that base. In addition the ratio between successive discharging currents during the RD interval would be $-1/B$ where B is the integral base for the number representation and the ratio between $t_u$ and $t_d$ would be B. This simple method of calculation on the base B counter can employ a low cost low speed counter because only a single digit of the counter need be incremented or decremented by one at each polarity test.

The sample and hold circuit 311 can be replaced by a variety of other offset adjusting circuits such as a stepwise adjustable D/A converter. In an alternative embodiment a stepwise adjustable D/A converter replaces the sample and hold circuit and couples the output of comparator 310 to the reference input of integrator 36. During the analog autozero cycle the D/A converter responds to the polarity signal to increase or decrease the offset voltage until the polarity of the polarity signal charges, at which point the discharging current is adjusted to zero.

The procedure during the PRD interval can also be modified to reduce the average number of polarity tests required during the PRD interval. The range of possible values of $V_{out}$ correspond to a range of up to 20 frames in the PRD interval before a change in the polarity of the integrator output voltage is achieved. Therefore up to 20 polarity tests must be performed during the PRD interval. The number of tests can be reduced to 10 by testing the polarity signal at the end of the RU interval and then at the start of the PRD interval supplying $I_{+4}$ for a frame of duration $t_u = 10 t_d$ if the polarity is negative and supplying $I_{-4}$ for a frame of duration $t_u$ if the polarity is positive—this shifts $V_{out}$ to within the range about zero corresponding to $\pm 10$ PRD frames. $I_{+4}$ is then applied for as many frames as are required to produce a positive polarity at a subsequent polarity test.

The scale of the A/D conversion is adjusted by adjusting the voltage of negative voltage source 321. To adjust the voltage a test signal of known magnitude is applied at input port 30 and the voltage of source 321 is adjusted until the digital indication in output display 332 corresponds to the known magnitude. By employing a stable voltage source this adjustment need not be repeated. Positive voltage source 321 need only be short term stable to hold a stable voltage in between analog autozero cycles. No long term stability is needed because long term drift shows up only as offset error which is eliminated in the digital autozero cycle.

We claim:

1. A multislope analog to digital converter for producing a digital indication of an input test signal, said converter comprising:

discharging means for supplying a discharging signal of magnitude and polarity controllably selected from the set of values $-(-B)^{n-1} I_1$ and $(-B)^k I_1$ for $k = 0, \ldots, n-1$ for some constant $I_1$, for some integer base B and for some integer $n > 2$;

an integrator responsive to the discharging signal and switchably responsive to the input test signal to produce an integrator output signal varying linearly in time with the time integral of the test signal and also varying linearly in time with the time integral of the discharging signal;

polarity means responsive to the integrator output signal for producing a polarity signal representing the polarity of the integrator output signal;

a clock to provide a clock signal;

a central processing unit coupled to the discharging means and responsive to the clock signal and to the polarity signal to periodically test the polarity signal and to regulate the magnitude and polarity of the discharging signal;

input switching means responsive to a signal from the central processing unit for applying the input test signal to the integrator for an interval of duration T;

calculating means coupled to the central processing unit for producing a digital value for the test signal from T and the magnitude and polarity of the discharging signal as a function of time; and output means coupled to the calculating means for producing a digital output indication of the digital value for the test signal.

2. A digital to analog converter as recited in claim 1 wherein the discharging means includes a voltage source, a pair of resistors of substantially equal resistance R and a pair of switches that are coupled in parallel to the voltage source, each of said switches coupling the voltage source to the integrator input through one of the resistors of resistance R.

3. A method of converting a test signal into a digital indication of the test signal, said method comprising the steps of:

(a) integrating the test signal for a run-up interval of known duration T;

(b) integrating a discharging signal of regulable known magnitude and polarity to produce an integrator output signal varying in time linearly with the time integral of the test signal and linearly with the time integral of the discharging signal;

(c) repetitively executing polarity tests of the output signal during the run-up interval and during a run-down interval subsequent to the run-up interval, said polarity tests defining a plurality of frames between successive polarity tests;

(d) regulating the magnitude and polarity of the discharging signal in each frame during the run-up interval to have opposite polarity to that of the output signal at the most recent preceding polarity test;

(e) regulating the magnitude and polarity of the discharging signal during the run-down interval to have opposite polarity to that of the output signal at the most recent preceding polarity test;

(f) determining, from the known magnitude and polarity of the discharging signal as a function of time, the time integral of the discharging signal over the interval extending from the start of the run-up interval to the end of the run-down interval; and (g) producing the digital indication from the time integral of the discharging signal and the duration T of the run-up interval.

4. A method as recited in claim 3 wherein the discharging signal magnitude can assume only a finite number of discrete values.

5. A method as recited in claim 4 wherein each frame in the run-up interval has a common known duration and each frame in the run-down interval has a common known duration.

6. A method as recited in claim 5 wherein during the run-up interval the discharging signal can assume only two non-zero values, said non-zero values being of equal magnitude and opposite polarity.

7. A method as recited in claim 5 wherein the step (e) of regulating the magnitude and polarity of the discharging signal during the run-down interval comprises the steps of:

(h) setting the magnitude of the discharging signal to an initial run-down value and setting the polarity opposite to that detected at the immediately preceding polarity test;

(i) when a change in polarity is detected at a polarity test, reversing the polarity and reducing the magnitude of the discharging signal;

(j) when a change in polarity is detected after step (i), terminating the integration of the discharging signal.

8. A method as recited in claim 7 further comprising the step of repeating step (i) a finite number of times before executing step (j).

9. A method as recited in claim 8 wherein the magnitude of each run-down value after the first one is an aliquot portion 1/B of the magnitude of the most recent preceding run-down value and the digital indication is in base B whereby successive values of the discharging signal during the run-down interval provide successively more accurate digits of sensitivity.

10. A method as recited in claim 9 wherein the discharging signal is non-zero for an interval of duration $t_u$ in each frame during the run-up interval and for a duration $t_u/B$ in each frame during the run-down interval.

11. A method as recited in claim 5 wherein the step (f) of determining the time integral of the discharging signal comprises the steps of incrementing a counter for each value of the magnitude of the discharging signal by a number P representing the product of that magnitude of the discharging signal times the duration that magnitude is assumed times the polarity of the discharging signal.

12. A method as recited in claim 11 wherein the magnitude of the discharging signal and the durations of the frames are selected such that each frame has an associated integer n where the magnitude $|P|$ of P equals $B^n$ for that frame whereby the step of incrementing the counter by P for that frame comprises incrementing the n-th least significant digit by $P/|P|$.

13. A method as recited in claim 3 further comprising between steps (d) and (e) the steps of:

(k) repetitively executing polarity tests of the output signal during a pre-run-down interval between the run-up interval and the run-down interval, said pre-run-down interval ending when positive polarity is detected at a polarity test;

(l) setting the magnitude of the discharging signal at a positive polarity value during the pre-run-down interval.

14. A method as recited in claim 4 wherein each frame in the run-up interval has a common known duration, wherein the discharging signal is supplied by a source having a switch A and a switch B, wherein said source provides a positive polarity signal when switches A and B are both off, provides a negative polarity signal when switches A and B are both on, and wherein the step (d) of regulating the magnitude of the discharging signal in each odd numbered frame during the run-up interval comprises:

(m) turning switch A on and Switch B off;

(n) checking the result of the most recent preceding polarity test;

(o) if the polarity of the output signal at the most recent preceding polarity test was positive, turning switch B on; and (p) if the polarity of the output signal at the most recent preceding polarity test was negative, turning switch A off;

and for each even numbered frame (q) turning switch A off and switch B on;

(r) checking the result of the most recent preceding polarity test;

(s) if the polarity of the output signal at the most recent preceding polarity test was positive, turning switch A on; and (t) if the polarity of the output signal at the most recent preceding polarity test was negative, turning switch B off.

15. A method as recited in claim 14 wherein steps (a)–(f) are performed for an unknown input test signal and further comprising before step (g) the steps of repeating steps (a)–(f) for a zero input test signal and subtracting the result of step (f) for the zero input test signal from the result of step (f) for the unknown input test signal to normalize the time integral of the discharging signal for use in step (g).

16. A method as recited in claim 14 further comprising before step (a) the step of analog auto-zeroing the source of the discharging signal to produce a zero discharging signal when switch A is on and switch B is off.

17. A method of converting a test signal into a digital indication of the test signal, said method comprising the steps of:
    (a) integrating the test signal for a run-up interval of duration T;
    (b) integrating a discharging signal of regulable known magnitude and polarity to produce a time integral of the discharging signal equal in magnitude to and of opposite polarity to the time integral of the discharging signal;
    (c) regulating the magnitude of the discharging signal to sequentially assume the values $M_k$ for $k=1, \ldots, N$ where N is an integer greater than two, where the k-th value is assumed for an integral multiple $n_k$ of a basic period of duration $t_d$, and where the k-th value $M_k$ equals $B^{N-k}M_N$ whereby successive values enable successively more sensitive base B places of digital conversion;
    (d) determining the time integral of the discharging signal; and
    (e) producing the digital indication using the time integral of the discharging signal and the duration T of the run-up interval.

18. A method as recited in claim 17 wherein step (d) of determining the time integral of the discharging signal comprises the steps of:
    (f) incrementing a base B counter by $n_k B^{N-k}$ for each value of k for which the discharging signal has positive polarity; and
    (g) decrementing the base B counter by $n_k B^{N-k}$ for each value of k for which the discharging signal has negative polarity, whereby for each value of k the counter need be incremented or decremented only in the k-th digit.

19. A method as recited in claim 18 further comprising before step (a) the step of selecting the values of T and $M_N$ to enable the direct output of the value in the counter as the digital indication of the test signal.

20. A method as recited in claim 17 further comprising the step of testing in each basic period of duration $t_d$ the polarity of the sum of the integrals of the test signal and the discharging signal and wherein the magnitude of the discharging signal is changed in step (c) to a successive value in the sequence $M_N, \ldots, M_1$ only at the end of a basic period in which a change in the polarity was detected, said discharging signal in each basic period having opposite polarity to the polarity of the sum of the integrals of the test signal and discharging signal detected in the prior period.

21. A multislope analog to digital converter for producing a digital indication of an input test signal, said converter comprising:
    an integrator having an input and an output to produce at its output an integrator output signal varying linearly in time with the time integral of signals applied at its input;
    a first voltage source;
    a pair of resistors of substantially equal resistance R;
    a pair of switches connected in parallel to the first voltage source, each of which switchably connects the first voltage source to the integrator input through one of the resistors of resistance R;
    a plurality of resistors;
    a plurality of switches connecting said plurality of resistors from the first voltage source to the input of the integrator in a configuration which in response to control signals to the switches can produce a total configuration resistance from the first voltage source to the input of the integrator equal to $B^k R$ for $k=0, \ldots, n-1$ for some integer base B and for some integer $n>1$;
    polarity means responsive to the integrator output signal for producing a polarity signal representing the polarity of the integrator output signal;
    a clock to provide a clock signal;
    a central processing unit coupled to the discharging means and responsive to the clock signal and to the polarity signal to periodically test the polarity signal and to supply control signals to the pair of switches and to the plurality of switches to produce a controllable discharging signal from the first voltage source to the input of the integrator;
    input switching means responsive to a signal from the central processing unit for applying the input test signal to the integrator for an interval of duration T; and
    calculating means coupled to the central processing unit for producing a digital value for the test signal from T and the magnitude and polarity of the discharging signal as a function of time.

* * * * *

UNITED STATES PATENT AND TRADEMARK OFFICE
CERTIFICATE OF CORRECTION

PATENT NO. : 4,357,600
DATED : November 2, 1982
INVENTOR(S) : James Ressmeyer, Joe E. Marriott and Lawrence T. Jones It is certified that error appears in the above–identified patent and that said Letters Patent are hereby corrected as shown below:

Column 1, line 26, "$V_{d\ell}$" should read -- $V_{d1}$ --; line 40, "then" should read -- than --;

Column 1, line 42, "empoyed" should read -- employed --;

Column 2, line 17, after "$\Delta t$" insert -- (where $\Delta t$ --;

Column 3, line 8, "integrtor" should read -- integrator --;

Column 10, line 23, "$I_{30\ 3}$" should read -- $I_{+3}$ --;

Column 11, line 29, "$I_{30\ 1}$" should read -- $I_{+1}$ --.

Signed and Sealed this

Twenty-ninth Day of March 1983

[SEAL]

Attest:

GERALD J. MOSSINGHOFF

Attesting Officer

Commissioner of Patents and Trademarks